United States Patent [19]
Ciniglio et al.

[11] Patent Number: 5,611,480
[45] Date of Patent: Mar. 18, 1997

[54] SOLDERING PROCESS

[75] Inventors: Alexander J. Ciniglio, Great Dunmow; Michael Tombs, Leigh-on-Sea; Neil Squire, Chelmsford, all of England

[73] Assignee: Pillarhouse International Limited, Essex, United Kingdom

[21] Appl. No.: 317,249

[22] Filed: Oct. 3, 1994

Related U.S. Application Data

[63] Continuation-in-part of Ser. No. 25,585, Mar. 3, 1993, Pat. No. 5,370,297.

[30] Foreign Application Priority Data

Mar. 3, 1992 [GB] United Kingdom ............... 9204525

[51] Int. Cl.$^6$ ........................................... H05K 3/34
[52] U.S. Cl. .................. 228/180.1; 228/259; 427/433
[58] Field of Search ..................... 228/259, 180.1, 228/260; 427/433

[56] References Cited

U.S. PATENT DOCUMENTS

| | | | |
|---|---|---|---|
| 2,870,532 | 1/1959 | Young | 228/260 |
| 3,056,371 | 10/1962 | Frank | 228/259 |
| 3,059,604 | 10/1962 | Brandys | 228/259 |
| 3,499,220 | 3/1970 | Hintz et al. | 228/259 |
| 4,869,418 | 9/1989 | Simpson et al. | 228/37 |

FOREIGN PATENT DOCUMENTS

| | | | |
|---|---|---|---|
| 0234850 | 2/1987 | European Pat. Off. . | |
| 0481710 | 4/1992 | European Pat. Off. . | |
| 51-9045 | 1/1976 | Japan | 228/40 |
| 62-76541 | 4/1987 | Japan | 228/40 |
| 64-18568 | 1/1989 | Japan | 228/260 |
| 58-86753 | 5/1993 | Japan . | |
| 2265325 | 9/1993 | United Kingdom | 228/180.1 |

*Primary Examiner*—P. Austin Bradley
*Assistant Examiner*—Jeffrey T. Knapp
*Attorney, Agent, or Firm*—Levisohn, Lerner, Berger & Langsam

[57] ABSTRACT

In a soldering process leads of components on a circuit board are dipped into a solder bath to solder them to the underside of the board. The board is rotated about a horizontal axis as it is lifted away from the bath. This reduces the tendency to form solder bridges between closely spaced leads.

19 Claims, 3 Drawing Sheets form 5,611,480

SOLDERING PROCESS

This application is a continuation-in-part of application Ser. No. 08/025,585 filed Mar. 3, 1993, now U.S. Pat. No. 5,370,297.

INTRODUCTION

The present invention relates to a dip soldering process. Dip soldering apparatus and processes are described, for example, in U.S. Pat. No. 4651916, EP-A-0234850 and EP-A-0481710.

BACKGROUND

The prior art systems raise, lower and rotate a component to be tinned in a dip soldering process by means of pneumatic drives. A drawback of this is that there is little or no control over the degree and rate of movement of the component.

Our application Ser. No. 08/025585 describes a dip soldering apparatus which uses independent motor drives for raising and lowering the component and for rotating it. This provides much more flexible control over the tinning process. When tinning or soldering leads which are closely spaced, there is a tendency for solder bridging between the leads. This is particularly a problem when soldering components to a printed circuit board.

SUMMARY OF THE INVENTION

The present invention provides a soldering method in which the printed circuit board is rotated as it leaves the solder bath. It has been found that this reduces the degree or likelihood of bridging between adjacent leads. The invention is particularly suited to soldering component leads to the underside of a printed circuit board, but is also useful with individual components when it is necessary to tin or solder closely spaced leads.

It is particularly preferred to use one or more variable speed motors such as a servo motor or stepper motor to control the movement of the component holder in the vicinity of the solder bath. It is possible to control and vary the rate of movement of the component, and also to rotate the component by a predetermined, variable amount and at a controlled rotational speed as it leaves the solder bath.

Other aspects, preferred features and advantages of the invention will be apparent from the following description and the accompanying claims.

DESCRIPTION OF THE PREFERRED EMBODIMENT

Figure 1:
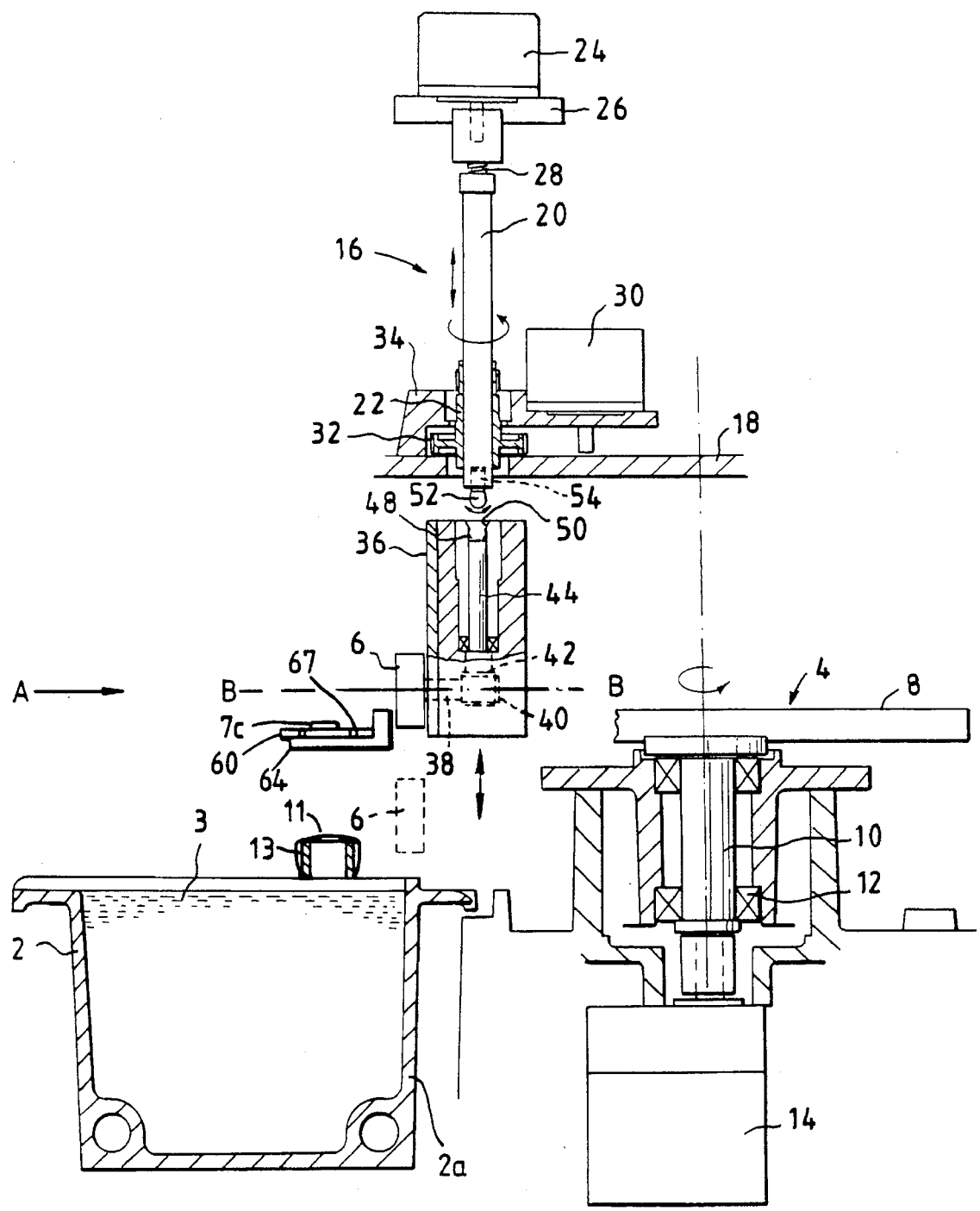
FIG. 1 of the drawings shows, in section, details of a dip soldering apparatus for performing the invention.
Figures 2, 3:
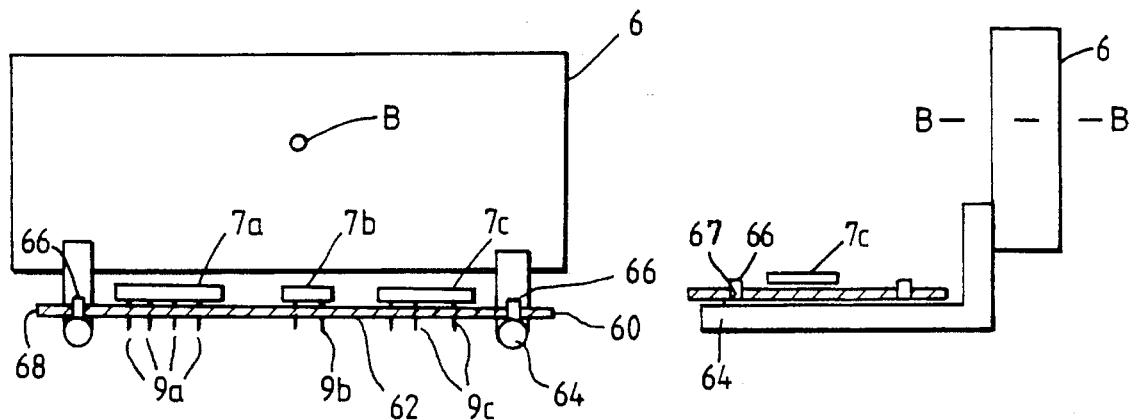
FIG. 2 is a detailed view on arrow A of FIG. 1 showing a component holder.
FIG. 3 is a side view of the component holder of FIG. 2.

FIGS. 1 to 3 of the drawings show a soldering apparatus comprising a solder bath 2 for containing molten solder 3, and a rotary station 4 carrying a plurality of holders 6 (only one is shown) supported on a rotatable table 8.

The holder 6 is shown carrying a printed circuit board 60 carrying components 7a, 7b, 7c having leads 9a, 9b, 9c which are to be soldered to the board 60 by dipping them into the molten solder 3, as will be described more fully hereinafter.

The table 8 is carried on a shaft 10 journalled in bearings 12 and rotated by a motor 14 to move the holder 6 stepwise through stations arranged around the table 8, as is well known in the art. Such stations may include stations for loading and unloading a board 60, a fluxing station for applying flux to tags or leads to be soldered or tinned and a testing station as well as a soldering/tinning station.

Arranged in a fixed position above each station is a drive unit 16 for raising and lowering the holder 6 and rotating the holder 6. The drive units 16 are mounted on a fixed table 18.

The drive unit 16 comprises a hexagonal cross-section drive shaft 20 which is slidably journalled in a hexagonal section bush 22. In another preferred embodiment a generally square cross-section shaft having arcuate side faces (sold under the trade mark 'polygon') may be used, as such shafts with the appropriate bush can provide reduced backlash in the rotational direction.

A first stepper motor 24 is mounted on a platform 26 and drives a lead screw 28 which is threadedly coupled to a vertical bore in the shaft 20. As screw 28 is rotated by the motor 24, the shaft 20 is moved vertically in the bush 22.

A second stepper motor 30 is mounted on the platform 18 and is coupled by a toothed belt (not shown) to a gear ring 32 formed on the bush 22, for rotating the bush 22 in a housing 34. As the bush 22 is rotated, the drive shaft 20 will also be rotated.

The holder 6 is mounted on a casing 36 which is mounted to slide vertically on the table 8. The casing 36 is urged to an uppermost position by a spring (not shown) as is generally well known in the art. The holder 6 is mounted on a shaft 38 journalled in the casing 36 and carrying a 45 degree helical gear 40 at its other end. Gear 40 meshes with a second helical gear 42 which is carried on the lower end of a shaft 44. The shaft 44 is rotable in the casing 36 so that as the shaft 44 rotates it rotates the holder 6.

The shaft 44 has a notch 48 at its upper end. Notch 48 has a square cross-section at its base and is flared at its mouth 50.

Drive shaft 20 carries a lobe 52 at its lower end. Lobe 52 is pivotably mounted on a pin 54 on the shaft 20, to pivot across the mouth of the notch 48 (as shown by the arrow). The lobe 52 has a cylindrical lower surface which is a snug fit in the square section base of the notch 48. As the drive shaft 20 is lowered, the lobe 52 engages in the base of the notch 48 to form a close coupling (ie. very little play) between the shaft 20 and shaft 44). The pivotal mounting of the lobe 52 provides a particularly simple mechanism for allowing for tolerance in the relative positions of the drive unit 16 and shaft 44 in the radial direction of the table 8.

In use, the rotary table 8 is rotated to bring a holder 6 into position at the soldering station, above the solder bath 2. Motor 24 is actuated to rotate lead screw 28 and drive shaft 20 downwards. Lobe 52 engages in the notch 48 and continued downward movement of shaft 20 moves the casing 36 and holder 6 down towards the solder bath 2 against the force of the spring tending to urge the casing 36 upwards. By using a variable speed motor 24 such as a stepper motor, the speed of driving the shaft 20 downwards, and hence the speed of vertical movement of the holder 6 can be varied, for example to slow the speed as the board 60 nears the bath, and so reduce thermal shock as the component leads 9 enter the solder 3.

Motor 24 is then reversed, again varying the speed if desired, to allow the casing 36 and holder 6 to move upwards under the action of the spring. The speed of upward movement is controlled by the upward movement of the shaft 20 under the action of the motor 24 which rotates the lead screw 28 in the reverse direction. The initial speed of upward movement is controlled to remove the component leads 9 from the solder 3 at a desired speed and the movement may then be accelerated to move the component holder 6 and casing 36 quickly to the fully raised position.

As will be described more fully hereinafter, the motor 30 is actuated to rotate shaft 20 which in turn rotates the shaft 44 in the casing 36 to rotate the component holder 6 about the axis B—B via the gear coupling 40,42, just as the component leads are being brought clear of the surface of the solder 3 by the upward motion of the holder 6. Stepper motor 30, via the shaft 20 and gear coupling 40, 42 controls the orientation of the holder 6 during vertical movement.

When the shaft 20 is fully raised and disengaged from shaft 44, the holder 6 would become free to rotate as the table 8 is rotated to move the casing 36 to the next station. To prevent this, the shaft 44 is returned to predetermined rotational position after soldering, where it is arranged to engage a key (not shown) as the casing 36 returns to its uppermost position.

The motors 24, 30 are under microprocessor control to allow ready programming of movement of the shaft 20 at each station, and a datum position for the shaft 20 is provided to avoid accumulated errors during operations.

Referring to FIG. 1, the solder bath 2 includes an apaplicator 13 which is generally tubular and extends down into the solder 3. The applicator 13 is mounted on a pump (not shown) which pumps molten solder up through the applicator 13 to overflow the sides of the applicator 13. This presents a fresh surface to the component leads 9a, 9b, 9c as the printed circuit board 60 is lowered onto the applicator 13 to immerse the leads in the solder, the board also contacting the solder.

Systems for pumping solder through an applicator are well known and described, for example, in U.S. Pat. No. 4651916 and U.S. Pat. No. 4700878.

Instead of a pumped solder system, the applicator 13 may be in the form of a pot which is lowered below the surface of the molten solder in the bath 2 to replenish it with solder and provide a fresh solder surface, and then raised above the surface for dipping the component leads into the solder. Again such pot-type systems are well known in the art.

The invention is suited to soldering component leads to the underside of a printed circuit board and is particularly suited to soldering only some of the components. This is achieved by providing an applicator having a mouth which is shaped to supply solder only to the areas of the board where the components to be soldered are mounted.

Thus the invention may find particular utility where a board is first soldered using a wave soldering device, and then additional components having closely spaced leads are subsequently mounted on the board.

FIGS. 2 and 3 illustrate more clearly the printed circuit board 60 carrying components 7a, 7b, 7c with leads 9a, 9b, 9c projecting through the underside 62 of the board 60.

The board 60 is carried on two arms 64 which each have a pair of pins 66 which project through holes 68 provided in the board 60 to locate the board. The arms 64 are mounted on the component holder 6 and arms of different shape or location may be provided to suit the board being soldered.

The component holder 6 is rotated about the axis B—B seen in FIGS. 1 and 3 and represented by the circle B in FIG. 2. The holder 6 rotates anticlockwise as seen in FIG. 2, but could of course rotate in the clockwise direction. As the holder 6 is rotated, by actuation of the motor 30, the left hand edge will move downwards and across to the right, as viewed in FIG. 2.

During actuation of the motor. 30, the motor 24 is actuated to raise the component holder 6, to counteract the downward movement of the edge 68, so that the edge 68 will tend to sweep horizontally and the board (to the right of the edge 68) is canted upwards at an angle.

The motors 24, 30 are under microprocessor control. distance of the edge 68 from the pivot axis B is measured and input to the microprocessor by an operator. The microprocessor then controls the speeds of the motors 24, 30 to achieve the desired lifting and rotation of the board 60 relative to the surface 11 of the solder 3.

Referring to FIG. 4 to 8, the process and effect of rotating the board 60 as the component leads 9, leave the surface 11 of the solder 3 will be described more fully.

Figure 4:
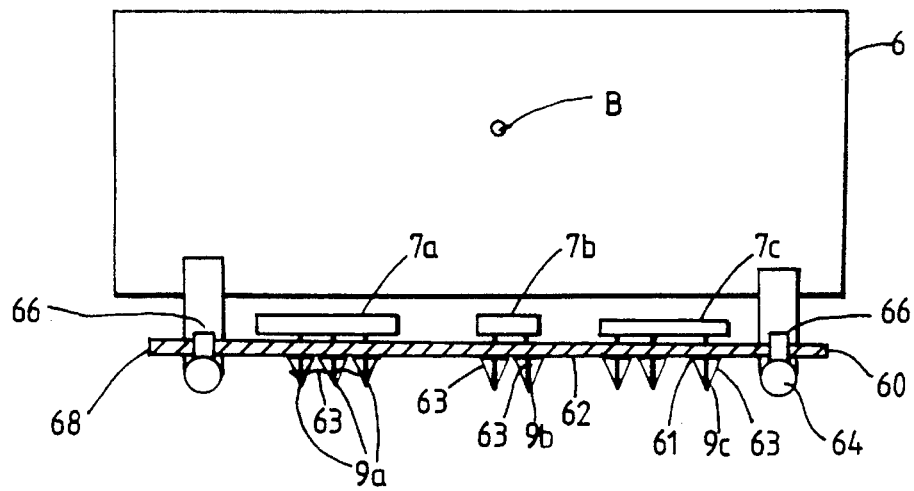
FIGS. 4 to 8 illustrate the process of soldering component leads to the underside of a circuit board in accordance with the invention.
Figure 5:
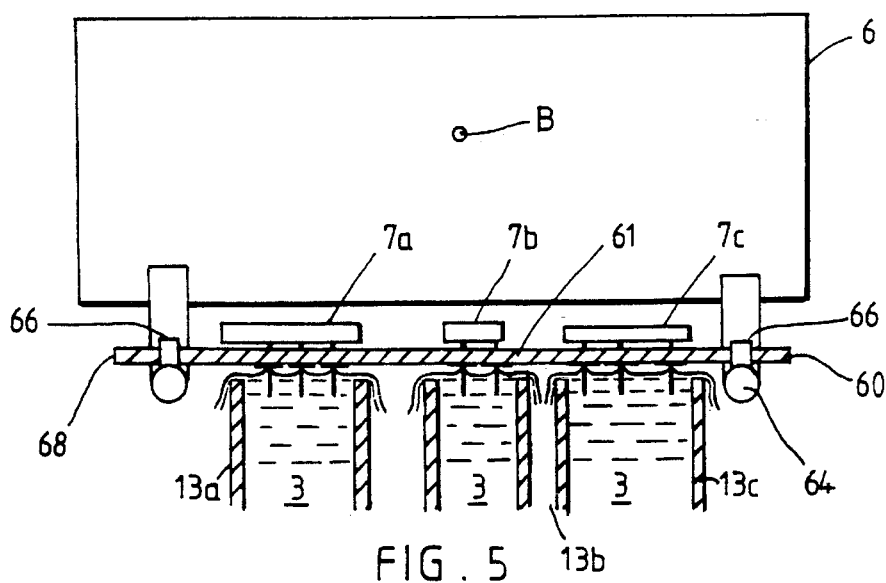

As shown in FIG. 4, if the leads 9a, 9b, 9c are soldered to the printed circuit tracks 61 on the underside 62 of the board 60, there is likely to be solder 63 bridging between the more closely spaced leads 9a.

To avoid or reduce the likelihood of this bridging the board 60 is rotated about a horizontal axis just as the board 60 is lifted away from the surface 11 of the solder in the applicator 13, as illustrated in FIGS. 5 through 8. The precise mechanism taking place as the component leads 9 are lifted from the solder surface 11 is not clear, but the following explanation is offered to assist in describing the process of the invention, while the applicants do not wish to be bound by the theory presented here.

It is believed that the effect of rotating the board 60 just as the leads 9 start to leave the surface 11 of the solder is make it easier for excess solder 3 to drain away from the underside of the board 60. The solder on a joint is able to drain towards the adjacent joint through the molten solder bridge which is temporarily formed between them.

In practice a solder joint will "take" sufficient solder for the particular joint. Thus this solder 63 which is taken by the joint will be retained at the joint, i.e. the junction of the lead 9 and its associated track 61 on the underside 62 of the board 60.

The solder in contact with the surface 11 of the main body of solder in the applicator 13 remains molten and so this molten bridge acts with gravity to allow solder to drain away from the joint. Also it is believed that the surface tension may have some effect to peel excess solder away from a joint.

Referring in more detail to FIGS. 5 to 8, FIG. 5 shows the component holder 6 lowered, with the board 60 generally horizontal and parallel to the surface 11 of the solder 3. The board is lowered until it bears on the surface of the solder 11.

The applicator 13 has three outlets 13a, 13b, 13c shaped to receive the leads of respective components 7a, 7b, 7c, the solder 3 being pumped up through each outlet.

Figure 6:
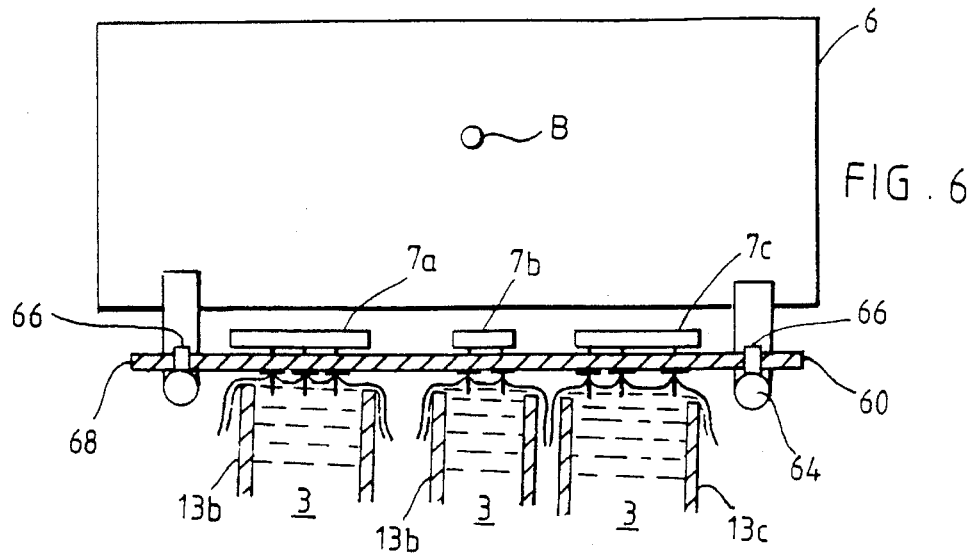

In FIG. 6 the component holder 6 has been rotated by a few degrees by actuation of the motor 30, and at the same time raised by actuation of the motor 24. This lifts the right hand edge of the board 60 away from the solder surface, while the left hand edge 68 stays close to the solder surface and is swept sideways to the right, by a small amount, across the solder surface. The solder on the leads 9c is peeled away from the leads 9c, leaving sufficient solder 63 to form the joint between a lead 9c and its respective track 61.

Figure 7:
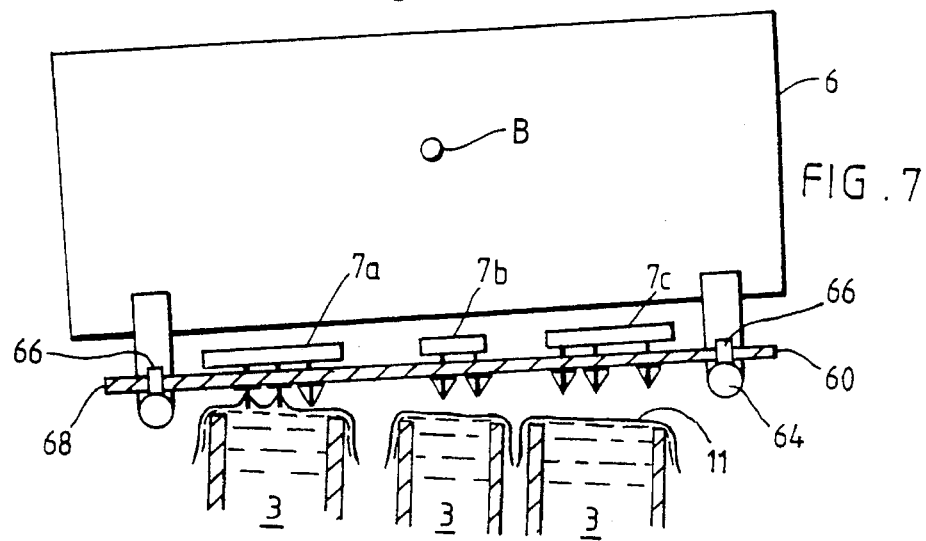
Figure 8:
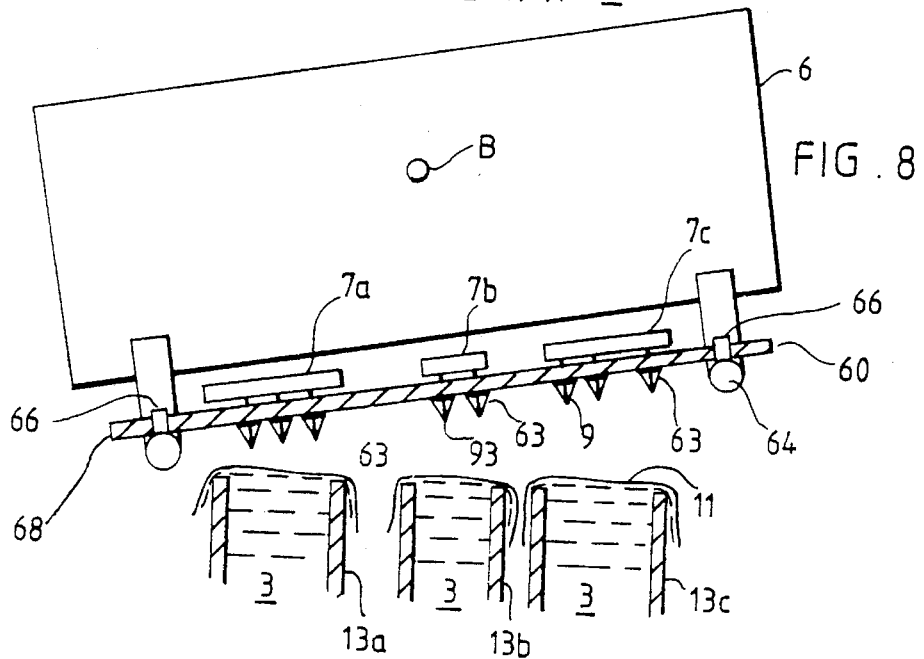

In FIG. 7 the board 60 has been rotated further to lift the leads 9c, 9b, away from the solder surface, while the leads 9a are in the process of being lifted away from the surface In FIG. 8, the leads 9a are lifted clear of the solder surface and the component holder 6 may then be raised more quickly by the motor 24 as the motor 30 is reversed to return the board 60 to the horizontal position.

The holder 6 may be arranged so that the edge 68 of the board 60 is vertically below the pivot axis B. In that event, simple rotation of the holder 6 would tilt the board, to peel it from the solder surface at an angle without the edge 68 moving down towards the solder. The preferred speed of vertical movement and rotation of the board depends on the spacing of the leads and the size and location of the board, and is best determined by trial and error. However, a speed of rotation of 3 to 6 degrees per second, and vertical movement from the solder surface of 2 to 5 mm per second is generally suitable. Preferably the speed of rotation is substantially constant, in which case the vertical movement will vary sinusoidally to maintain the board edge 68 in a generally horizontal plane.

It will be appreciated that the invention is also applicable to soldering and tinning closely spaced leads of components, as well as to soldering component leads to printed circuit boards.

Various modifications may be made to the described embodiment and it is desired to include all such modifications as fall within the accompanying claims.

What we claim is:

1. A dip soldering process for soldering electrical component leads to a printed circuit board, comprising the steps of:
   (a) providing a bath of molten solder and a printed circuit board having circuit tracks printed on the underside thereof, said circuit board having electrical component leads extending out of the underside of said circuit board and said printed circuit tracks extending adjacent said electrical component leads;
   (b) lowering the underside of said circuit board and said electrical component leads toward the surface of said bath, said underside of said circuit board being initially, substantially coplanar with the surface of said bath, said circuit board being lowered into said bath in a direction perpendicular to said surface of said bath to dip said electrical component leads into said bath such that the molten solder in said bath wets said electrical component leads and said printed circuit tracks; and,
   (c) while vertically lifting said circuit board and said electrical component leads from said bath, simultaneously rotating said circuit board about a horizontal axis to cause an edge of said circuit board to tend to horizontally sweep, substantially parallel to said surface of said bath, while said circuit board is lifted upwardly out of said bath so that the electrical component leads nearest to said edge of said circuit board are the last electrical component leads to leave said bath.

2. A process as claimed in claim 1, wherein said horizontal axis is located at said edge of said circuit board.

3. A process as claimed in claim 1, wherein said horizontal axis is located above said circuit board and between the edges of said circuit board.

4. A dip soldering process for soldering the leads of electrical components to a printed circuit board to mount said electrical components to said circuit board, said process comprising the steps of:
   (a) providing a bath of molten solder and a printed circuit board having a pair of opposed edges, said circuit board having electrical component leads projecting from the underside of said circuit board and having circuit tracks on said underside of said circuit board;
   (b) lowering said circuit board into said bath to dip said electrical component leads into said bath to wet the same with molten solder; and,
   (c) simultaneously rotating and vertically lifting said circuit board, said circuit board being rotated about a horizontal axis of rotation which is parallel to the surface of said bath, and said circuit board being lifted away from said bath such that said rotating and lifting causes the leads of said electrical components closest to one of said edges of said circuit board to substantially, horizontally sweep, parallel to said surface of said bath so that the electrical component leads nearest to said edge are the last electrical component leads to leave said bath.

5. A process as claimed in claim 4, further comprising the step of providing an applicator having a plurality of outlets, and pumping solder through said outlets to form said surface at an upper end of said outlets.

6. A process as claimed in claim 4, wherein said horizontal axis is located at the trailing edge of said circuit board.

7. A process as claimed in claim 4, wherein said horizontal axis is located above said circuit board and between said edges of said circuit board.

8. A dip soldering process for soldering the leads of electrical components to a basically flat printed circuit board, said process comprising the steps of:
   (a) providing a bath of molten solder and a basically flat printed circuit board, said circuit board having electrical component leads extending through said circuit board;
   (b) lowering said circuit board towards said bath to wet said electrical component leads into said bath;
   (c) rotating said circuit board about a horizontal axis so that at least some of said electrical component leads at a leading edge of said circuit board emerge from said bath before all of said electrical leads emerge from said bath; and,
   (d) simultaneously raising said circuit board such that the trailing edge of said circuit board will horizontally sweep across the surface of said bath as said circuit board is lifted upwardly out of said bath so that the electrical component leads nearest to the trailing edge are the last electrical component leads to leave said bath.

9. A process as claimed in claim 8, further comprising the steps of providing an applicator having a plurality of outlets, and pumping molten solder through said outlets to form said surface of said bath at an upper end of said outlets.

10. A process as claimed in claim 8, wherein said horizontal axis is located at said trailing edge of said circuit board.

11. A process as claimed in claim 8, wherein said horizontal axis is located above said circuit board and between the edges of said circuit board.

12. A dip soldering process for soldering the leads of electrical components to a printed circuit board, said process comprising the steps of:
   (a) providing a bath of molten solder and a printed circuit board having a leading edge portion and a trailing edge portion, said circuit board having electrical component leads extending through to the underside of said circuit board and near to both said leading edge and trailing edge portions;

(b) lowering said circuit board toward the surface of said bath to dip and wet all of said electrical component leads;

(c) removing and tilting said leading edge portion of said circuit board from said bath to progressively lift said electrical component leads near to said leading edge portion out of said bath while maintaining at least some of said leads of said electrical components near said trailing edge portion in said bath; and, (d) continuing said removing and tilting of said circuit board as progressively more of said electrical component leads leave said bath until said trailing edge leaves said bath to facilitate draining of excess solder from the underside of said circuit board so that electrical component leads nearest to said trailing edge portion are the last electrical component leads to leave said bath.

13. A process as claimed in claim 12, further comprising the steps of providing an applicator having a plurality of outlets, and pumping molten solder through said outlets to form said surface of said bath at an upper end of said outlets.

14. A dip soldering process for soldering a plurality of spaced apart electrical component leads to an object, said process comprising the steps of:

(a) providing a bath of molten solder and an object having electrical component leads extending through to the underside of said object, said object having a leading edge portion and a trailing edge portions, with at least some of said electrical component leads near to both said leading and trailing edge portions,;

(b) lowering said object toward said bath, said object being lowered in a direction substantially normal to the surface of said bath, to dip and wet all of said electrical component leads into said bath; and, (c) simultaneously rotating and lifting said object about a horizontal axis to said surface of said bath to progressively withdraw said electrical component leads commencing at said leading edge portion so that the electrical component leads nearest to said trailing edge portion are the last component leads to exit from said bath.

15. A process as claimed in claim 14, wherein said object is a printed circuit board.

16. A process as claimed in claim 14, further comprising the steps of providing an applicator having a plurality of outlets, and pumping molten solder through said outlets to form said surface of said bath at an upper end of said outlets.

17. A process as claimed in claim 14 wherein said horizontal axis is located at said trailing edge portion of said circuit board.

18. A process as claimed in claim 14 wherein said horizontal axis is located above said circuit board and between said leading and trailing edge portions of said circuit board.

19. A process as claimed in claim 14, wherein said trailing edge of said circuit board is caused to horizontally sweep across said bath during said steps of rotating and lifting.

* * * * *